United States Patent
Nagano et al.

(10) Patent No.: US 6,849,887 B2
(45) Date of Patent: Feb. 1, 2005

(54) SEMICONDUCTOR DEVICE AND METHOD FOR FABRICATING THE SAME

(75) Inventors: Yoshihisa Nagano, Osaka (JP); Toshie Kutsunai, Osaka (JP); Yuji Judai, Kyoto (JP); Yasuhiro Uemoto, Shiga (JP); Eiji Fujii, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/103,873

(22) Filed: Jun. 24, 1998

(65) Prior Publication Data

US 2002/0056861 A1 May 16, 2002

(30) Foreign Application Priority Data

Jun. 24, 1997 (JP) ............................................. 9-166991

(51) Int. Cl.⁷ .............................................. H01L 29/76
(52) U.S. Cl. ....................... 257/295; 257/296; 257/306; 257/310; 438/240; 438/253; 438/396
(58) Field of Search ................................. 257/295–296, 257/300, 310, 638–641, 771, 763, 532; 438/240, 253, 256, 396, 399, 3, 250, 393, 763

(56) References Cited

U.S. PATENT DOCUMENTS

| 5,132,774 A | 7/1992 | Matsuura et al. |
| 5,250,468 A | 10/1993 | Matsuura et al. |
| 5,344,797 A | 9/1994 | Pai et al. |

(List continued on next page.)

FOREIGN PATENT DOCUMENTS

| DE | 41 00 525 | 8/1991 |
| EP | 0 499 433 | 8/1992 |
| EP | 0 557 937 | 9/1993 |
| JP | 3-133131 | 6/1991 |
| JP | 6-291317 | 10/1994 |
| JP | 6-350083 | 12/1994 |
| JP | 7-161952 | 6/1995 |

OTHER PUBLICATIONS

Fundamentals of Chemical of Chemical Vapor Deposition. TEOS/OZONE Thermal CVD. Film Quality: Moisture, Stress, Cracking. Tutorial [online]. TimeDomain CVD Inc., 2002 [retrieved on Feb. 18, 2004]. Retrieved from the Internet: < URL: http://www.timedomaincvd.com/CVD_Fundamentals/films/TEOS_O3_thermal.html >.*
Wolf et al.,"Silicon Processing for the VLSI Era Vol. 1: Process Technology", Lattice Press, 1986, pp. 182–194.*
K. Fujino et al., Reaction Mechanism of TEOS and O3 Atmospheric Pressure, IEEE Conference, 1991, pp 445–447.*
H. Wallace Fry et al., "Applications of APCVD TEOS/O3 thin films in ULSI IC Fabrication", Solid State Technology, 1994, pp 31–40.*
K. Fujino et al., "Doped silicon oxide deposition by atmospheric pressure and low temperature chemical vapor deposition using TEOS and Ozone", The Electrochemical Society, Inc., 1191, pp 3019–3024.*

Primary Examiner—Tom Thomas
Assistant Examiner—José R. Díaz
(74) Attorney, Agent, or Firm—RatnerPrestia

(57) ABSTRACT

A semiconductor device includes: a capacitor provided on a supporting substrate having an integrated circuit thereon and including a lower electrode, a dielectric film, and an upper electrode; a first interlayer insulating film provided so as to cover the capacitor; a first interconnect selectively provided on the first interlayer insulating film and electrically connected to the integrated circuit and the capacitor through a first contact hole formed in the first interlayer insulating film; a second interlayer insulating film formed of ozone TEOS and provided so as to cover the first interconnect; a second interconnect selectively provided on the second interlayer insulating film and electrically connected to the first interconnect through a second contact hole formed in the second interlayer insulating film; and a passivation layer provided so as to cover the second interconnect.

16 Claims, 11 Drawing Sheets

U.S. PATENT DOCUMENTS

| | | | |
|---|---|---|---|
| 5,374,578 A | * 12/1994 | Patel et al. | 438/3 |
| 5,439,840 A | 8/1995 | Jones, Jr. et al. | |
| 5,444,012 A | 8/1995 | Yoshizumi et al. | |
| 5,459,353 A | * 10/1995 | Kanazawa | 257/751 |
| 5,503,882 A | 4/1996 | Dawson | |
| 5,523,595 A | 6/1996 | Takenaka et al. | |
| 5,561,623 A | 10/1996 | Ema | |
| 5,580,814 A | * 12/1996 | Larson | 438/3 |
| 5,608,251 A | * 3/1997 | Konuma et al. | 257/337 |
| 5,624,864 A | * 4/1997 | Arita et al. | 438/3 |
| 5,650,359 A | 7/1997 | Ahlburn | |
| 5,747,830 A | 5/1998 | Okita | |
| 5,750,419 A | * 5/1998 | Zafar | 438/3 |
| 5,767,541 A | * 6/1998 | Hanagasaki | 257/295 |
| 5,789,762 A | * 8/1998 | Koyama et al. | 257/66 |
| 5,815,223 A | 9/1998 | Watanabe et al. | |
| 5,872,401 A | 2/1999 | Huff et al. | |
| 5,960,252 A | * 9/1999 | Matsuki et al. | 438/240 |
| 5,990,507 A | * 11/1999 | Mochizuki et al. | 257/295 |
| 6,004,839 A | * 12/1999 | Hayashi et al. | 438/210 |
| 6,130,102 A | * 10/2000 | White et al. | 438/3 |
| 6,274,424 B1 | * 8/2001 | White et al. | 438/239 |

OTHER PUBLICATIONS

Kazuo Maeda et al., "CVD TEOS/O3: Development History and Applications", Solid State Technology, 1993, pp. 83–88.*

European Search Report dated Sep. 30, 1998 for EP 98 11 1608.

S. Wolf Ph.D., et al., "Silicon Processing for the VLSI Era", Process Technology, vol. 1, pp. 189–191, Jul. 22, 1999.

* cited by examiner

500

SEMICONDUCTOR DEVICE AND METHOD FOR FABRICATING THE SAME

BACKGROUND OF THE INVENTION

1. Field of the Invention

The present invention relates to a semiconductor device including a capacitor having a dielectric film formed of a dielectric material having a high dielectric constant or a ferroelectric material, and a method for fabricating the same.

2. Description of the Related Art

Recently, as functions of consumer electric and electronic appliances have been more and more advanced along with higher processing rates and lower power consumption of microcomputers, the size of semiconductor devices used in the microcomputers has rapidly decreased. This has been accompanied by the serious problem of unnecessary radiation, which is electromagnetic wave noise generated from the electric and electronic appliances.

In order to reduce the unnecessary radiation, technologies for incorporating a capacitor having a large capacitance including a dielectric film formed of a dielectric material having a high dielectric constant (hereinafter, referred to as a "high dielectric constant material film") into a semiconductor device have been the target of attention. Furthermore, in accompaniment of higher integration dynamic RAMs (DRAMs), technologies for using a high dielectric constant material film in the capacitor, in lieu of a silicon oxide film and a silicon nitride film which are conventionally used, have been widely studied.

Furthermore, in order to realize non-volatile RAMs which are operable at lower voltages and provide higher read/write rates, ferroelectric material films exhibiting spontaneous polarization have been actively studied.

The most important point in realizing semiconductor devices having the above-described features is to develop a structure which permits multi-layered interconnects without deteriorating the characteristics of the capacitor and a method for fabricating such a structure.

Hereinafter, an exemplary conventional method for fabricating a semiconductor device 500 will be described with reference to FIGS. 10A through 10E (cross-sectional views).

As shown in FIG. 10A, an integrated circuit 4 and a device isolating insulating layer 5 are formed on a supporting substrate 1. The integrated circuit 4 includes a MOS field effect transistor (MOSFET) having a gate electrode 2, and source and drain regions 3. An insulating layer 6 is formed on the resultant laminate. A film which will act as a lower electrode 7 of a capacitor 10 is formed on the insulating layer 6 by sputtering or electron beam deposition. Then, a dielectric film 8 made of a high dielectric constant material film or a ferroelectric material film is formed on the film to act as the lower electrode 7 by metal organic deposition, metal organic chemical vapor deposition, or sputtering. Subsequently, a film which will act as an upper electrode 9 is formed on the dielectric film 8 by sputtering or electron beam deposition. Then, the layers 7, 8 and 9 are patterned into desirable patterns, thereby forming a capacitor 10.

Next, as shown in FIG. 10B, a first interlayer insulating film 11 is formed on the insulating layer 6 so as to cover the capacitor 10. Contact holes 12 are formed so as to run through the first interlayer insulating film 11 and reach, respectively, the lower electrode 7 and the upper electrode 9 of the capacitor 10. Contact holes 13 are also formed so as to run through the first interlayer insulating film 11 and the insulating layer 6 and reach, respectively, the source and drain regions 3. Conductive layers are formed on the first interlayer insulating film 11 and in the contact holes 12 and 13 by sputtering or the like, and patterned into desired patterns. Thus, first interconnects 14 for electrically connecting the integrated circuit 4 and the capacitor 10 are formed. The first interconnects 14 are then subjected to a thermal treatment.

As shown in FIG. 10C, a second interlayer insulating film 15 are formed on the resultant laminate so as to cover the first interconnects 14. The second interlayer insulating film 15 is formed by substantially planarizing, by etch-back, a silicon oxide film formed by plasma CVD using tetraethyl orthosilicate (TEOS) (hereinafter, referred to as a "plasma TEOS film") or a laminate including the above-described plasma TEOS film and a silicon-on-glass (SOG) film.

As shown in FIG. 10D, contact holes 16 are formed so as to run through the second interlayer insulating film 15 and reach the first interconnects 14. Second interconnects 17 are selectively formed on the second interlayer insulating film 15 and in the contact holes 16 so as to be electrically connected to the first interconnects 14. The second interconnects 17 are then subjected to a thermal treatment.

As shown in FIG. 10E, a passivation layer 18 is formed so as to cover the second interconnects 17 on the resultant laminate. Thus, the semiconductor device 500 is fabricated.

In the above-described method for fabricating the semiconductor device 500, the second interlayer insulating film 15 needs to be formed so as to have no step and a flat top surface and thus have a sufficient step coverage property. The reason for this is that, when the second interlayer insulating film 15 has a step, the second interconnects 17 to be formed thereon may disadvantageously be disconnected at the step. Accordingly, the conventional second interlayer insulating film 15 formed of a plasma TEOS film or the like needs to have a thickness $h_1$ (FIG. 10C) of about 1 μm or more on the first interconnects 14 above the upper electrode 9 and also have a thickness $h_2$ (FIG. 10C) of about 2 μm or more on the first interlayer insulating film 11 on an edge of the dielectric film 8 formed of a high dielectric constant material film or a ferroelectric material film.

Generally, however, when the force per unit thickness is constant, a thicker layer results in a stronger tensile or compressive stress. Thus, when the thickness of the second interlayer insulating film 15 is as thick as above-described, a significantly strong stress is applied to the capacitor 10 provided below the second interlayer insulating film 15.

Specifically when the second interlayer insulating film 15 is formed of a plasma TEOS film, the compressive stress acting on the dielectric film 8 prevents the polarization of the dielectric material forming the dielectric film 8. As a result, the physical properties of the dielectric film 8 formed of the high dielectric constant material or ferroelectric material deteriorate.

As used herein, the term "stress" refers to a force for contracting the layer (hereinafter, referred to as a "tensile stress") and/or a force for expanding the layer (hereinafter, referred to as a "compressive stress").

SUMMARY OF THE INVENTION

A semiconductor device of the present invention includes: a capacitor provided on a supporting substrate having an integrated circuit thereon and including a lower electrode, a dielectric film, and an upper electrode; a first interlayer insulating film provided so as to cover the capacitor; a first interconnect selectively provided on the first interlayer insulating film and electrically connected to the integrated circuit and the capacitor through a first contact hole formed in the first interlayer insulating film; a second interlayer insulating film formed of ozone TEOS and provided so as to cover the first interconnect; a second interconnect selectively provided on the second interlayer insulating film and electrically connected to the first interconnect through a second contact hole formed in the second interlayer insulating film; and a passivation layer provided so as to cover the second interconnect.

In one embodiment, the dielectric film is formed from either a dielectric material having a high dielectric constant or a ferroelectric material.

In one embodiment, the second interconnect is provided on the second interlayer insulating film so as to cover at least a part of the capacitor.

The passivation layer may be formed of a laminate including a silicon oxide film and a silicon nitride film.

In one embodiment, a hydrogen supplying layer is further provided between the first interconnect and the second interlayer insulating film excluding an area in which the capacitor is provided.

The first interconnect may be formed from a laminate including titanium, titanium nitride, aluminum and titanium nitride; a laminate including titanium, titanium nitride and aluminum; a laminate including titanium, titanium tungsten, aluminum and titanium tungsten; or a laminate including titanium, titanium tungsten and aluminum.

Preferably, a Si—OH bond absorption coefficient of the second interlayer insulating film at a wavelength corresponding to 3450 $cm^{-1}$ is 800 $cm^{-1}$ or less.

Preferably, the second interlayer insulating film has a tensile stress of $1 \times 10^7$ $dyn/cm^2$ to $3 \times 10^9$ $dyn/cm^2$ inclusive.

Preferably, the second interlayer insulating film has a thickness of 0.3 $\mu m$ to 1 $\mu m$ inclusive.

The second interconnect may be formed from a laminate including titanium, aluminum and titanium nitride; a laminate including titanium and aluminum; or a laminate including titanium, aluminum and titanium tungsten.

A method for fabricating a semiconductor device of the present invention includes the steps of: sequentially forming a lower electrode, a dielectric film, and an upper electrode on a supporting substrate having an integrated circuit, thereby forming a capacitor; forming a first interlayer insulating film so as to cover the capacitor; forming a first contact hole in the first interlayer insulating film; selectively forming a first interconnect in the first contact hole and on a prescribed area of the first interlayer insulating film so as to be electrically connected to the integrated circuit and the capacitor; forming a second interlayer insulating film of ozone TEOS so as to cover the first interconnect; subjecting the second interconnect to a first thermal treatment; forming a second contact hole in the second interlayer insulating film; selectively forming a second interconnect in the second contact hole and on a prescribed area of the second interlayer insulating film so as to be electrically connected to the first interconnect; subjecting the second interconnect to a second thermal treatment; and forming a passivation layer so as to cover the second interconnect.

In one embodiment, the dielectric film is formed from either a dielectric material having a high dielectric constant or a ferroelectric material.

In one embodiment, the method further includes the step of etching back the second interlayer insulating film using the second interconnect as a mask to such an extent as to almost expose the first interconnect.

In one embodiment, the step of forming the second interconnect includes the step of forming the second interconnect so as to cover at least a part of the capacitor.

In one embodiment, the passivation layer is formed of a laminate including a silicon oxide film and a silicon nitride film, and the silicon oxide film is formed by normal-pressure CVD, low-pressure CVD or plasma CVD, with using silane, disilane or ozone TEOS, so as to have a tensile stress.

In one embodiment, the method further includes the steps of: after the first interconnect is formed, forming a hydrogen supplying layer on the first interconnect excluding an area where the capacitor is provided; and performing a third thermal treatment.

The hydrogen supplying layer may be formed from either silicon nitride or silicon nitride oxide by plasma CVD.

Preferably, the third treatment performed after the formation of hydrogen supplying layer is performed at a temperature in the range of 300° C. to 450° C. inclusive.

Preferably, the third treatment performed after the formation of the hydrogen supplying layer is performed in an oxygen atmosphere, a nitrogen atmosphere, an argon atmosphere, or an atmosphere of a mixed gas thereof.

The first interlayer insulating film may be formed of silicon oxide by normal-pressure CVD or low-pressure CVD, with using silane, disilane or ozone TEOS.

The first interlayer insulating film may be formed of phosphorus-doped silicon oxide by normal-pressure CVD or low-pressure CVD.

Preferably, an ozone concentration upon forming the second interlayer insulating film using ozone TEOS is set to be 5.5% or more.

Preferably, the second interlayer insulating film after being subjected with the first thermal treatment has a tensile stress of $1 \times 10^7$ $dyn/cm^2$ to $2 \times 10^9$ $dyn/cm^2$ inclusive.

Preferably, the first thermal treatment is performed at a temperature in the range of 300° C. to 450° C. inclusive.

Preferably, the first thermal treatment is performed in an atmosphere containing at least oxygen.

Preferably, the second thermal treatment is performed at a temperature in the range of 300° C. to 450° C. inclusive.

Preferably, the second thermal treatment is performed in an atmosphere containing at least one of nitrogen, argon and helium.

According to the present invention, the second interlayer insulating film is formed of an ozone TEOS film, which performs self-reflow when being formed. Therefore, sufficient step coverage is obtained as a result of sufficient planarization of a top surface of the second interlayer insulating film without increasing the thickness of an area of the second interlayer insulating film above a capacitor (i.e., without generating any step). Specifically, the thickness of the second interlayer insulating film is about 1 $\mu m$ or less. Since the second interlayer insulating film to be formed is thin, the stress acting on the capacitor is alleviated.

Since the ozone TEOS film has a tensile stress, the deterioration in the characteristics of the capacitor caused by the stress is suppressed.

When the second interconnect is formed on the second interlayer insulating film so as to cover at least a part of the capacitor, the stress acting on the capacitor by the passivation layer is counteracted by the stress in the second interconnect provided on the capacitor. Accordingly, the stress acting on the capacitor is alleviated.

When the passivation layer is formed of a laminate including a silicon oxide film and a silicon nitride film, the silicon oxide film is a tensile stress. Thus, by forming a silicon nitride film having a large compressive stress by plasma CVD on the passivation layer, the stress in the passivation layer is counteracted. As a result, the stress acting on the capacitor is alleviated.

When a hydrogen supplying layer is provided, the hydrogen in the hydrogen supplying layer is thermally diffused to a supporting substrate having a semiconductor integrated circuit formed thereon by annealing the hydrogen supplying layer. Thus, the supporting substrate recovers from the damage caused during fabrication of the integrated circuit. The hydrogen supplying layer can be formed of a silicon nitride or a silicon nitride oxide containing a sufficient amount of hydrogen therein. By performing the above-mentioned annealing (thermal treatment) in an oxygen atmosphere, a nitrogen atmosphere, an argon atmosphere or a mixture of the above gases after the hydrogen supplying layer is formed, thermal diffusion of hydrogen is performed smoothly.

When the first interconnect and/or the second interconnect is formed of the above-mentioned laminate, a highly reliable interconnect is obtained without causing penetration of the constituent material.

When the ozone TEOS film forming the second interlayer insulating film has a Si—OH bond absorption coefficient of 800 $cm^{-1}$ or less at a wavelength corresponding to 3450 $cm^{-1}$, the moisture content in the ozone TEOS film is at a minimum possible value. Accordingly, moisture which deteriorates the characteristics of the capacitor, especially OH radicals and H radicals, is restricted from entering the capacitor.

When the ozone TEOS film forming the second interlayer insulating film has a tensile stress of $1 \times 10^7$ $dyn/cm^2$ to $3 \times 10^9$ $dyn/cm^2$ inclusive, adverse effects on the capacitor (e.g., undesirable restriction of polarization) caused by the stress applied to the capacitor are alleviated. Thus, the characteristics of the capacitor are improved. This effect largely relies on the fact that the stress is a tensile stress. A capacitor which is supplied with a tensile stress, e.g., from an ozone TEOS film has more preferable characteristics than a capacitor which is supplied with a compressive stress, e.g., from a plasma TEOS film, even when the absolute values of the stresses are equal.

By reducing the thickness of the ozone TEOS film forming the second interlayer insulating film to a range of 0.3 $\mu$m to 1 $\mu$m inclusive, the stress in the ozone TEOS film is lowered, and the stress acting on the capacitor from the ozone TEOS film is also lowered. Accordingly, the characteristics of the capacitor are improved. Furthermore, when the second interlayer insulating film is etched back using the second interconnect as a mask, the thickness of an area of the second interlayer insulating film above the capacitor (where the second interconnect is not usually provided) is further reduced (e.g., to 0.5 $\mu$m or less). Thus, the effect of reducing the stress and suppressing the deterioration in the characteristics are further enhanced.

When the ozone concentration upon forming the ozone TEOS film as the second interlayer insulating film is 5.5% or more, the stress in the ozone TEOS film is alleviated. The moisture content in the ozone TEOS film is also reduced. Moreover, generation of cracks by thermal treatment is prevented. Accordingly, the characteristics of the capacitor are further improved.

When the first interlayer insulating film is formed of a silicon oxide film by normal-pressure CVD or low-pressure CVD using silane, disilane or ozone TEOS, or formed of a phosphorus-doped silicon oxide film by normal-pressure CVD or low-pressure CVD, the resultant layer is reliable.

When the temperature for the thermal treatment (first thermal treatment) performed on the second interlayer insulating film (the ozone TEOS film) is in the range of 300° C. to 450° C. inclusive, the ozone TEOS film becomes dense. When the above-described thermal treatment is performed in an atmosphere containing oxygen, oxygen is supplied to the dielectric film. Thus, the characteristics of the capacitor are improved.

When the thermal treatment on the second interconnect (i.e., the second thermal treatment) is performed under the above-described conditions, the second interconnect becomes dense, and the stress acting on the capacitor is lowered.

Thus, the invention described herein makes possible the advantages of providing a semiconductor device having a structure for allowing a capacitor thereof to have superior characteristics as a result of suppressing deterioration in the characteristics caused by a stress applied on the capacitor, and a method for fabricating such a semiconductor device.

These and other advantages of the present invention will become apparent to those skilled in the art upon reading and understanding the following detailed description with reference to the accompanying figures.

DESCRIPTION OF THE PREFERRED EMBODIMENTS

Figure 1A:
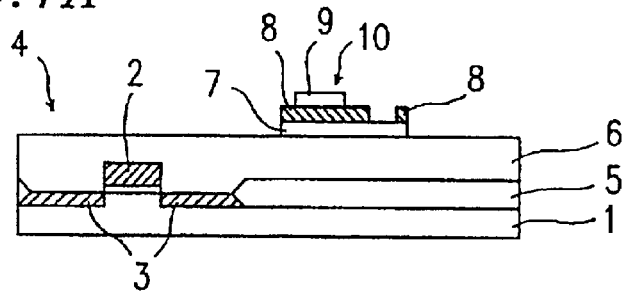
FIGS. 1A through 1E are cross-sectional views illustrating a method for producing a semiconductor device according to a first example of the present invention.

The present invention will be described by way of illustrative but not limiting examples with reference to the accompanying drawings. Identical or similar elements described with reference to FIGS. 10A through 10E will bear identical reference numerals therewith and detailed descriptions thereof will be omitted.

EXAMPLE 1

FIGS. 1A through 1E are cross-sectional views illustrating a method for fabricating a semiconductor device 100 according to a first example of the present invention.

As shown in FIG. 1A, an integrated circuit 4 and a device isolating insulating layer 5 are formed on a supporting substrate 1 formed of silicon or the like. The integrated circuit 4 includes a MOSFET having a gate electrode 2, and source and drain regions 3. An insulating layer 6 is formed on the resultant laminate. A film which will act as a lower electrode 7 of a capacitor 10 is formed on the insulating layer 6 by sputtering or electron beam deposition. Then, a dielectric film 8 made of a high dielectric constant material film or a ferroelectric material film is formed on the film to act as the lower electrode 7 by metal organic deposition, metal organic chemical vapor deposition, or sputtering. Subsequently, a film which will act as an upper electrode 9 is formed on the dielectric film 8 by sputtering or electron beam deposition. Then, the layers 7, 8 and 9 are patterned into desirable patterns, thereby forming a capacitor 10.

The formation of the insulating layer 6 can be omitted, in which case the capacitor 10 is formed directly on the device isolating insulating layer 5. This is also applicable to examples described below.

The lower electrode 7 and the upper electrode 9 of the capacitor 10 can be formed of, for example, platinum, palladium, ruthenium, ruthenium oxide, iridium, or iridium oxide. In the case where the dielectric film 8 is formed of a high dielectric constant material, a material having a specific dielectric constant of 20 to 500 inclusive can be used. Alternatively, in the case where the dielectric film 8 is formed of a ferroelectric material, a material having remnant polarization without any need of application of an external voltage can be used. Examples of the high dielectric constant materials and ferroelectric materials usable for the dielectric film 8 include $Ba_{1-x}Sr_xTiO_3$, $SrTiO_3$, $Ta_2O_5$, $PbZr_{1-x}Ti_xO_3$, $SrBi_2Ta_2O_9$, and $SrBi_2Ta_xNb_{1-x}O_9$.

Figure 1B:
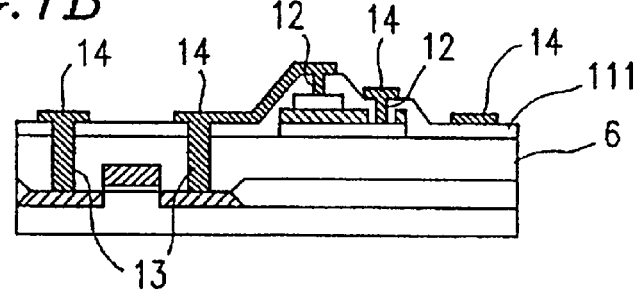

Next, as shown in FIG. 1B, a first interlayer insulating film 111 is formed on the insulating layer 6 so as to cover the capacitor 10. The first interlayer insulating film 111 is formed of a silicon oxide film, which is produced by thermal CVD using, as a material gas, gas-state TEOS in a normal-pressure atmosphere containing ozone (hereinafter, such a silicon oxide film will be referred to as an "ozone TEOS film"). Contact holes 12 are formed so as to run through the first interlayer insulating film 111 and reach, respectively, the lower electrode 7 and the upper electrode 9 of the capacitor 10. Contact holes 13 are also formed so as to run through the first interlayer insulating film 111 and the insulating layer 6 and reach, respectively, the source and drain regions 3. A laminate including titanium, titanium nitride, aluminum and titanium nitride is formed on the first interlayer insulating film 111 and in the contact holes 12 and 13 by sputtering or the like, and then patterned into desired patterns. Thus, first interconnects 14 for electrically connecting the integrated circuit 4 and the capacitor 10 are formed.

Figure 1C:
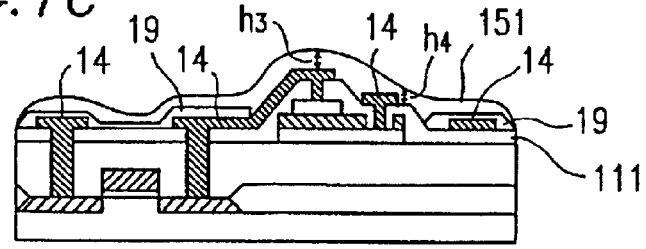

As shown in FIG. 1C, a hydrogen supplying layer 19 for supplying the integrated circuit with hydrogen is formed on the first interlayer insulating film 111 having the first interconnects 14, excluding an area where the capacitor 10 is provided, by plasma CVD. Then, the resultant laminate is annealed at about 450° C. for about an hour in an oxygen atmosphere in order to thermally diffuse hydrogen in the hydrogen supplying layer 19. The hydrogen supplying layer 19 is formed of, for example, silicon nitride or silicon nitride oxide and contains a sufficient amount of hydrogen therein.

The annealing is performed in order to allow hydrogen in the hydrogen supplying layer 19 to reach the supporting substrate 1, at a surface of which the integrated circuit 4 is provided, by thermal diffusion. Thus, the integrated circuit 4 recovers from the damage caused by the dry etching which is performed for forming the contact holes 13 during the annealing with oxygen at a temperature of 600° C. or higher as is required to form the dielectric film 8. The annealing temperature can be in the range of 300° C. to 450° C. inclusive. The annealing can be performed in a nitrogen atmosphere, an argon atmosphere or a mixed gas atmosphere of oxygen and nitrogen and/or argon in lieu of the oxygen atmosphere.

Then, a second interlayer insulating film 151 is formed of an ozone TEOS film on the resultant laminate so as to cover the first interconnects 14. The ozone TEOS film performs self-reflow when being formed, and permits formation of the second interlayer insulating film 151 having no step and a sufficiently flat top surface and thus having satisfactory step coverage although still being sufficiently thin.

The above point will be described with reference to FIGS. 11A and 11B.

Figure 11A:
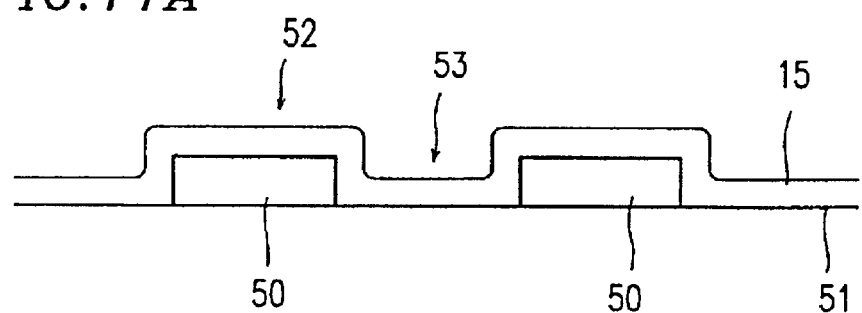
FIG. 11A is a schematic cross-sectional view of a silicon oxide film formed by conventional plasma CVD so as to cover a wiring pattern provided on a substrate surface.
Figure 11B:
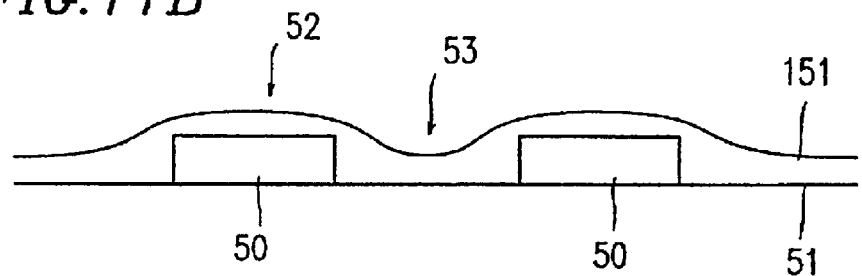
FIG. 11B is a schematic cross-sectional view of a silicon oxide film formed by thermal CVD performed in an atmosphere containing ozone so as to cover a wiring pattern provided on a substrate surface.

FIG. 11A is a schematic cross-sectional view of the second interlayer insulating film 15 formed of silicon oxide (plasma TEOS) on a substrate surface 51 so as to cover wiring patterns 50. The second interlayer insulating film 15 is formed by conventional plasma CVD. FIG. 11B is a schematic cross-sectional view of the second interlayer insulating film 151 formed of silicon oxide (ozone TEOS) on the substrate surface 51 so as to cover the wiring patterns 50. The second interlayer insulating film 151 is formed by thermal CVD performed in an atmosphere containing ozone in accordance with the present invention. In the following description, the conventional second interlayer insulating film 15 will also be referred to as the plasma TEOS film, and the second interlayer insulating film 151 according to the present invention will also be referred to as the ozone TEOS film for easier understanding.

By the plasma CVD, solid silicon oxide particles are formed in plasma (gas phase), and the solid silicon oxide particles adhere to the substrate surface 51 and surfaces of the wiring patterns 50. The adhering probability of the solid silicon oxide particles is uniform regardless of the surface to which it adheres. As a result, the resultant plasma TEOS film 15 has substantially the same thickness in areas 52 corresponding to the wiring patterns 50 and an area 53 corresponding to a region between the wiring patterns 50. Accordingly, the plasma TEOS film 15 need to be formed to be relatively thick in order to have a flat top surface.

By the thermal CVD performed in an atmosphere containing ozone, gas-state TEOS as a material gas reacts with oxygen on the substrate surface 51 and the surfaces of the wiring patterns 50. Thus, silicon oxide is produced. The reaction occurs more readily in the area 53 corresponding to the region between the wiring patterns 50 than in the areas 52 corresponding to the wiring patterns 50. Accordingly, the ozone TEOS film 151 is first formed so as to bury the area 53 and then gradually expand to the areas 52 in a self-reflow. In this manner, the ozone TEOS film 151 obtains a flat top surface while remaining relatively thin.

For example, the thickness of the second interlayer insulating film 151 made of ozone TEOS which is required to form the second interconnect 17 thereon without any disconnection is $h_3$=about 0.8 μm (FIG. 1C) on the first interconnect 14 above the upper electrode 9 of the capacitor 10 and $h_4$=about 0.5 μm (FIG. 1C) on the first interlayer insulating film 111 on the edge of the dielectric film 8 formed of a high dielectric constant material film or a ferroelectric material film. As can be understood from this, a sufficient step coverage is achieved while significantly reducing the thickness of the second interlayer insulating film (151), compared to the conventional technology by which the second interlayer insulating film (15) is formed of plasma TEOS.

The ozone used in the above-described process permits, as an active element, the reaction for producing silicon oxide to occur at a lower temperature.

After the formation of the second interlayer insulating film 151, annealing is performed at about 450° C. for about an hour in an oxygen atmosphere as a first thermal treatment, thereby allowing the second interlayer insulating film 151 made of an ozone TEOS film to become dense and also supplying the capacitor 10 with oxygen.

Figure 1D:
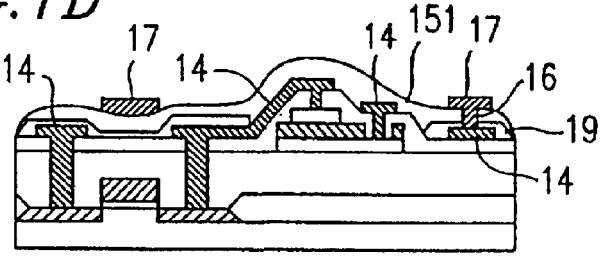

Then, as shown in FIG. 1D, contact holes 16 are formed so as to run through the second interlayer insulating film 151 and reach the first interconnects 14. A laminate including titanium, aluminum and titanium nitride is formed on the second interlayer insulating film 151 and in the contact holes 16 by sputtering or the like and patterned into a desired pattern. Thus, the second interconnects 17 electrically connected to the first interconnects 14 are formed. Then, annealing is performed at about 400° C. for about 30 minutes in a nitrogen atmosphere as a second thermal treatment, thereby making the second interconnects 17 dense and alleviating the stress thereof.

Figure 1E:
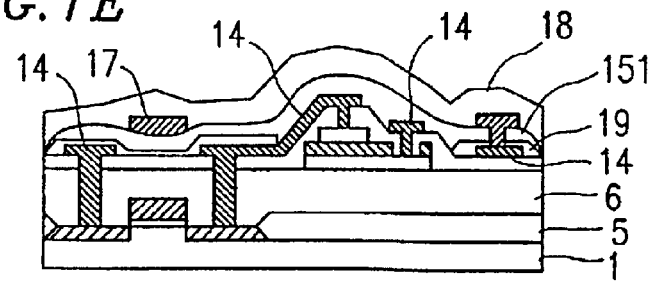

As shown in FIG. 1E, a passivation layer 18 is formed of silicon nitride on the resultant laminate by plasma CVD, so as to cover the second interconnects 17. In this manner, the semiconductor device 100 in the first example is completed.

According to the structure of the semiconductor device 100 using ozone TEOS for forming the second interlayer insulating film 151, a sufficient step coverage is obtained. This allows a portion of the second interlayer insulating film 151 located on the capacitor 10 to be thinner. Thus, the stress acting on the capacitor 10 is alleviated.

Figure 2:
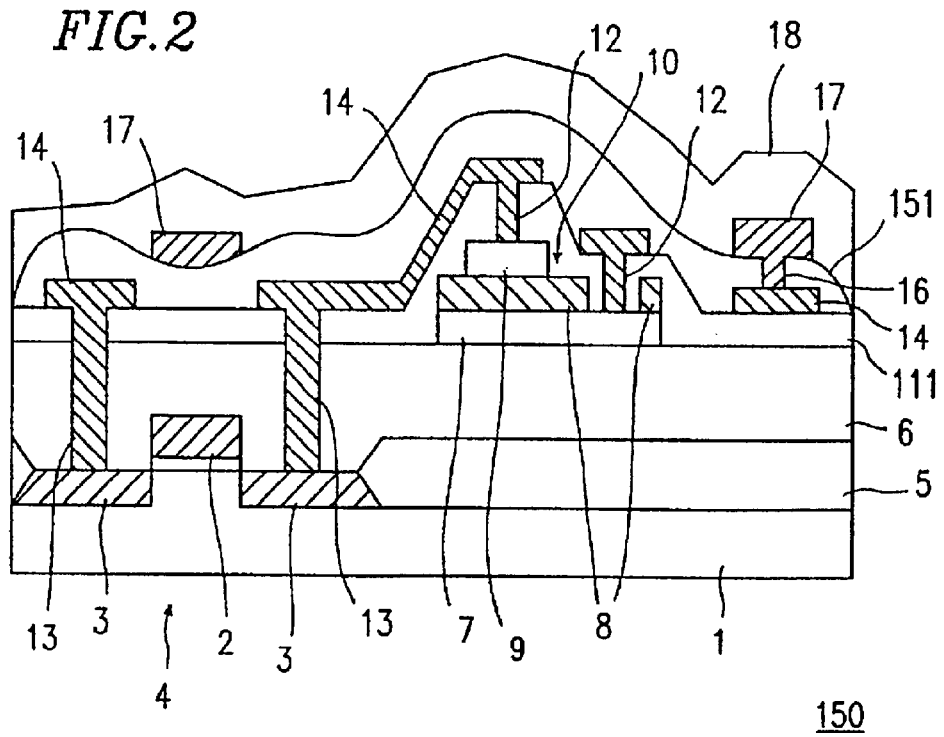
FIG. 2 is a cross-sectional view of a semiconductor device in a modification of the first example according to the present invention.

In the case where the integrated circuit 4 is not damaged while being fabricated, the hydrogen supplying layer 19 can be eliminated. FIG. 2 shows a cross-sectional view of a semiconductor device 150 which does not include the hydrogen supplying layer 19. The characteristics of the capacitor 10 are identical with those of the capacitor 10 shown in FIGS. 1A through 1E.

As described above, the ozone TEOS film 151 is formed by thermal CVD, by which silicon oxide is formed on the substrate by simultaneously supplying TEOS in a gas-state and ozone. This method does not require excitation of plasma upon the film formation.

Figure 3:
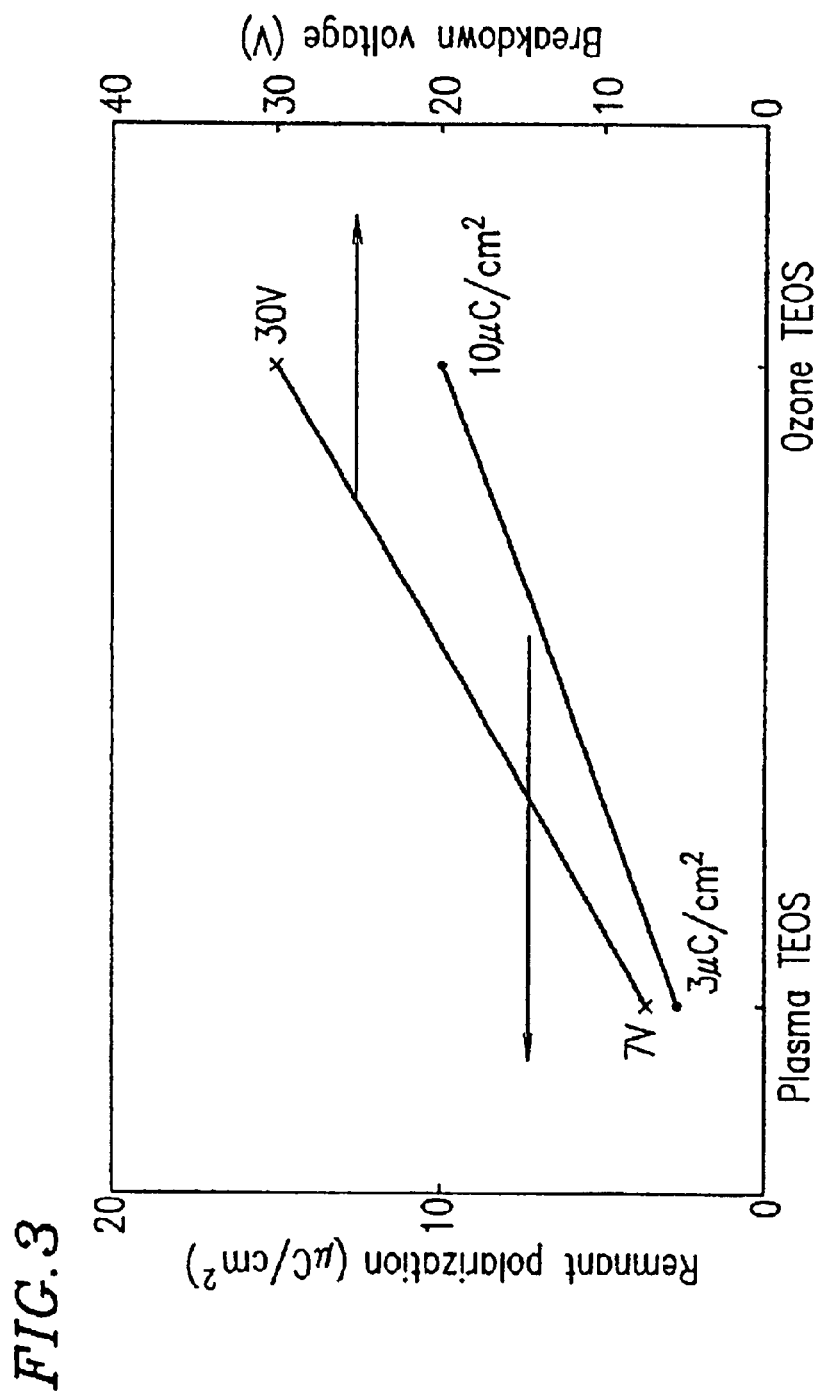
FIG. 3 is a graph illustrating characteristics of a capacitor in the semiconductor device in the first example.

FIG. 3 is a graph illustrating the characteristics (remnant polarization and breakdown voltage) of the capacitor 10 including a dielectric film 8 formed of $SrBi_2Ta_2O_9$, in the case where a second interlayer insulating film 151 formed of ozone TEOS is used, and in the case where a conventional second interlayer insulating film formed of plasma TEOS is used. For measurement, the plasma TEOS film is first formed to have a thickness of 3.4 μm and then the thickness is reduced to 1.5 μm by resist etch-back. The ozone TEOS film in this example is formed to have a thickness of 1 μm without using etch-back.

A sample including 110 capacitors connected in parallel, each having the above-described structure with an electrode area of 23 μm² is produced for the measurement. The remnant polarization of the sample is measured using RT6000A Ferroelectric Tester. The breakdown voltage of the sample is measured using HP4195B.

The following can be seen from FIG. 3. In the case where the conventional plasma TEOS film is used, the remnant polarization is 3 μC/cm² and the breakdown voltage is 7 V. In the case where the ozone TEOS film in the first example is used, the remnant polarization is 10 μC/cm² and the breakdown voltage is 30 V. Thus, the structure according to the first example of the present invention improves the remnant polarization by 7 μC/cm² and the breakdown voltage by 23 V, as compared to the conventional structure.

EXAMPLE 2

FIGS. 4A through 4E are cross-sectional views illustrating a method for fabricating a semiconductor device 200 according to a second example of the present invention. The second example is different from the first example in that, after the second interlayer insulating film 151 is formed, a prescribed part of the second interlayer insulating film 151 is selectively etched back using the second interconnects 17 as masks.

Figure 4A:
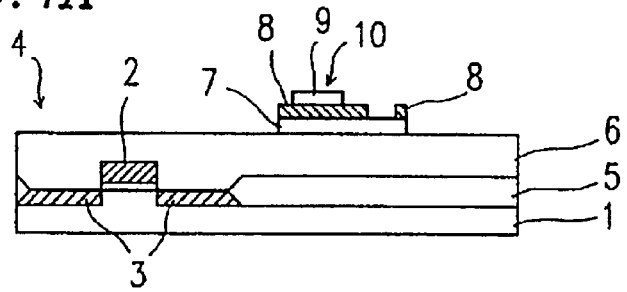
FIGS. 4A through 4E are cross-sectional views illustrating a method for producing a semiconductor device according to a second example of the present invention.
Figure 4B:
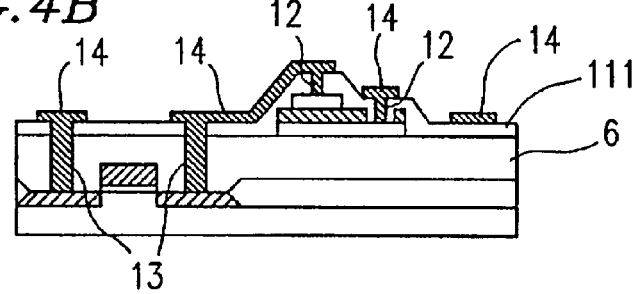
Figure 4C:
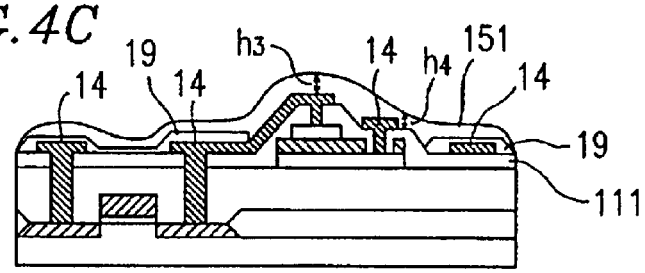

First, the steps shown in FIGS. 4A through 4C, which are identical with the steps shown in FIGS. 1A through 1C, are performed.

Figure 4D:
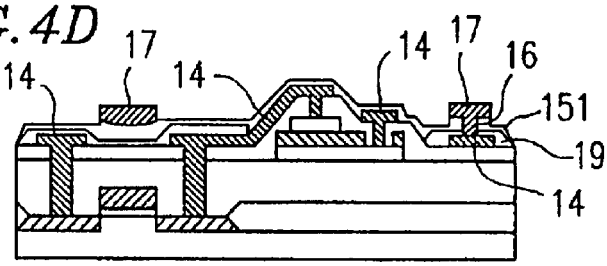

Then, as shown in FIG. 4D, contact holes 16 are formed so as to run through the second interlayer insulating film 151 and reach the first interconnects 14. A laminate including titanium, aluminum and titanium nitride is formed on the second interlayer insulating film 151 and in the contact holes 16 by sputtering or the like, and then patterned into a desired pattern. Thus, the second interconnects 17 electrically connected to the first interconnects 14 are formed.

The second interlayer insulating film 151 is then etched back using the second interconnects 17 as masks to such an extent as to almost expose the first interconnects 14. Then, annealing is performed at about 400° C. for about 30 minutes in a nitrogen atmosphere as a second thermal treatment, thereby making the second interconnects 17 dense and alleviating the stress thereof.

Figure 4E:
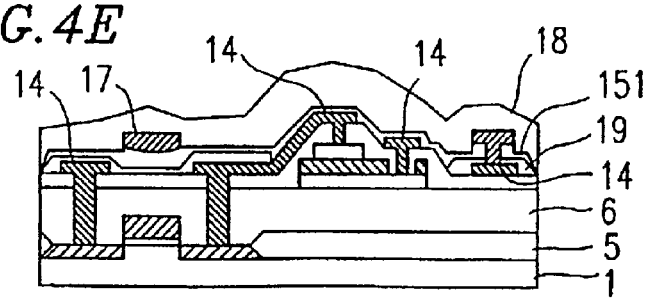

As shown in FIG. 4E, the passivation layer 18 is formed of silicon nitride on the resultant laminate by plasma CVD, so as to cover the second interconnects 17. In this manner, the semiconductor device 200 in the second example is completed.

Generally, the second interconnects 17 are not provided on an area of the second interlayer insulating film 151 which is not located on the capacitor 10. According to the structure of the semiconductor device 200 in which the second interlayer insulating film 151 is formed of ozone TEOS and etched back using the second interconnects 17 as masks, the thickness of a part of the second interlayer insulating film 151 located on the capacitor 10 is further reduced, compared to the semiconductor device 100 in the first example. Accordingly, the stress acting on the capacitor 10 is further alleviated.

Figure 5:
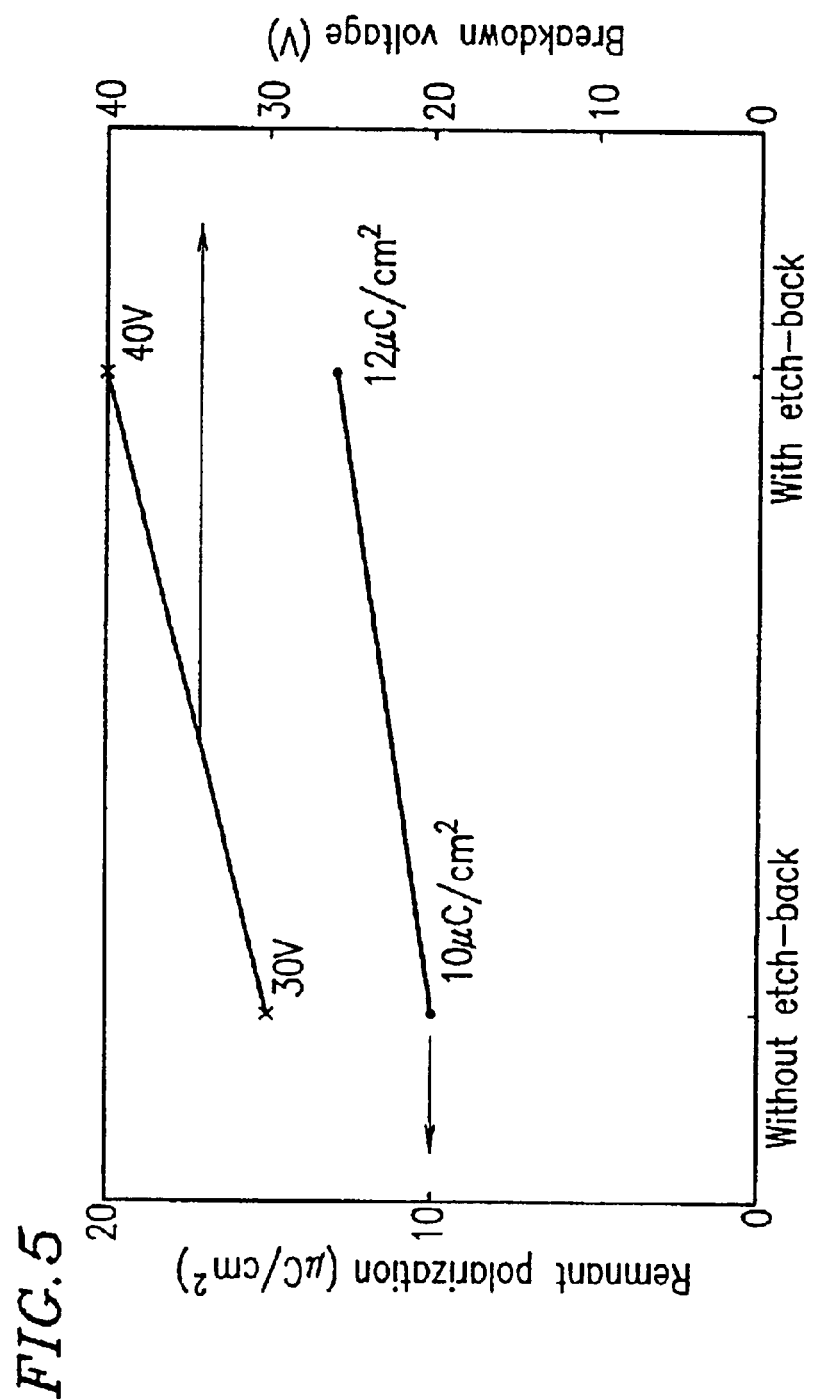
FIG. 5 is a graph illustrating characteristics of a capacitor in the semiconductor device in the second example.

FIG. 5 is a graph illustrating the characteristics (remnant polarization and breakdown voltage) of the capacitor 10 including a dielectric film 8 formed of $SrBi_2Ta_2O_9$ in the case where a second interlayer insulating film 151 formed of ozone TEOS is etched back, and in the case where a second interlayer insulating film 151 formed of ozone TEOS is not etched back. For measurement, the ozone TEOS film is first formed to have a thickness of 1 μm. In the case where the second interlayer insulating film 151 is etched back, the thickness of the film 151 is reduced to 0.5 μm. In the case where the second interlayer insulating film 151 is not etched back, the thickness of the film 151 is maintained 1 μm. The methods and conditions for measuring the remnant polarization and breakdown voltage are the same as those in the first example.

The following can be seen from FIG. 5. In the case where the ozone TEOS film is etched back, the remnant polarization is 12 $\mu C/cm^2$ (as opposed to 10 $\mu C/cm^2$ without etch-back) and the breakdown voltage is 40 V (as opposed to 30 V without etch-back). Thus, the structure according to the second example of the present invention further improves the remnant polarization by 2 $\mu C/cm^2$ and the breakdown voltage by 10 V, as compared to the structure according to the first example of the present invention.

EXAMPLE 3

FIGS. 6A through 6E are cross-sectional views illustrating a method for fabricating a semiconductor device 300 according to a third example of the present invention.

The third example is different from the first and second examples in that the second interconnects 17 electrically connected to the first interconnects 14 are also provided on a prescribed area of the second interlayer insulating film 151 which is above the capacitor 10 so as to cover the capacitor 10.

Figure 6A:
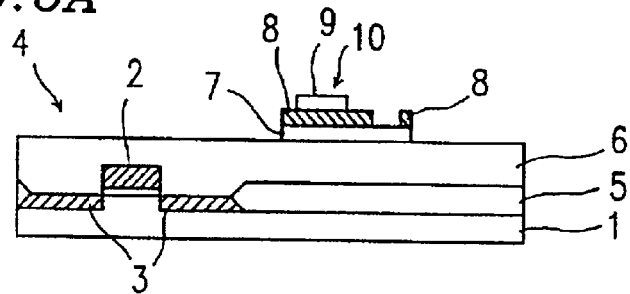
FIGS. 6A through 6E are cross-sectional views illustrating a method for producing a semiconductor device according to a third example of the present invention.
Figure 6B:
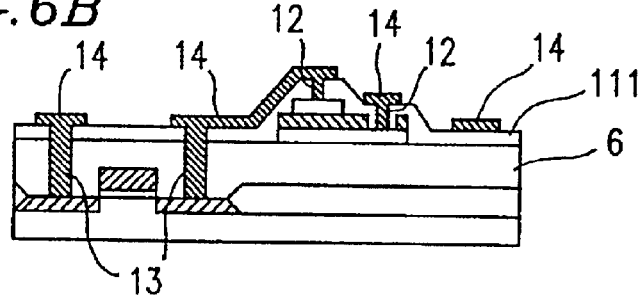
Figure 6C:
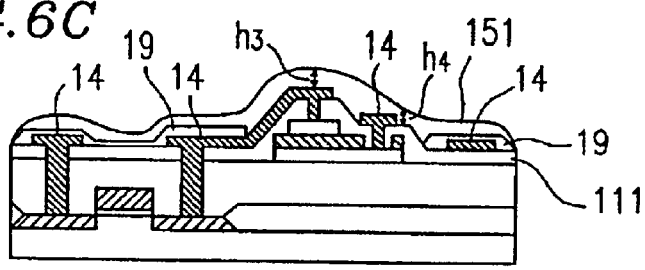

First, the steps shown in FIGS. 6A through 6C, which are identical with the steps shown in FIGS. 1A through 1C, are performed.

Figure 6D:
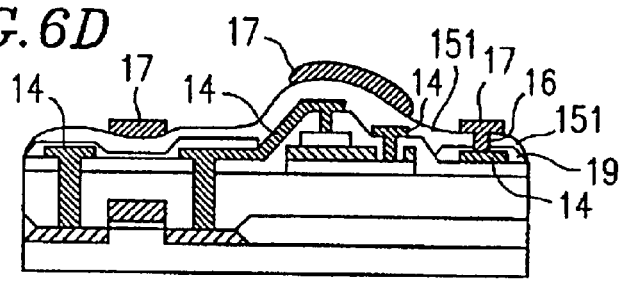

Then, as shown in FIG. 6D, contact holes 16 are formed so as to run through the second interlayer insulating film 151 and reach the first interconnects 14. A laminate including titanium, aluminum and titanium nitride is formed on the second interlayer insulating film 151 and in the contact holes 16 by sputtering or the like, and then patterned into a desired pattern. Thus, the second interconnects 17 electrically connected to the first interconnects 14 are formed. The laminate is patterned also to cover the area corresponding to the capacitor 10.

Figure 6E:
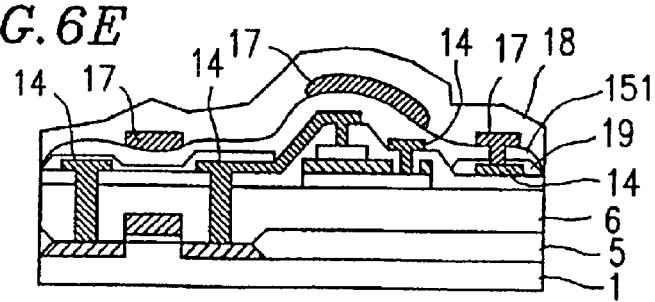

The second interlayer insulating film 151 may be etched back, using the second interconnects 17 as masks, to such an extent as to almost expose the first interconnects 14. The etch-back on this stage can be eliminated, as seen in FIGS. 6D and 6E. Then, annealing is performed at about 400° C. for about 30 minutes in a nitrogen atmosphere as a second thermal treatment, thereby making the second interconnects 17 dense and alleviating the stress thereof.

Then, as shown in FIG. 6E, the passivation layer 18 is formed of silicon nitride on the resultant laminate by plasma CVD, so as to cover the second interconnects 17. In this manner, the semiconductor device 300 in the third example is completed.

According to the structure of the semiconductor device 300 in which the second interconnects 17 are provided on the second interlayer insulating film 151 so as to cover the capacitor 10, the stress applied to the capacitor 10 from the passivation layer 18 is counteracted by the stress generated by the second interconnect 17 located above the capacitor 10. As a result, the stress acting on the capacitor 10 is sufficiently alleviated.

Figure 7:
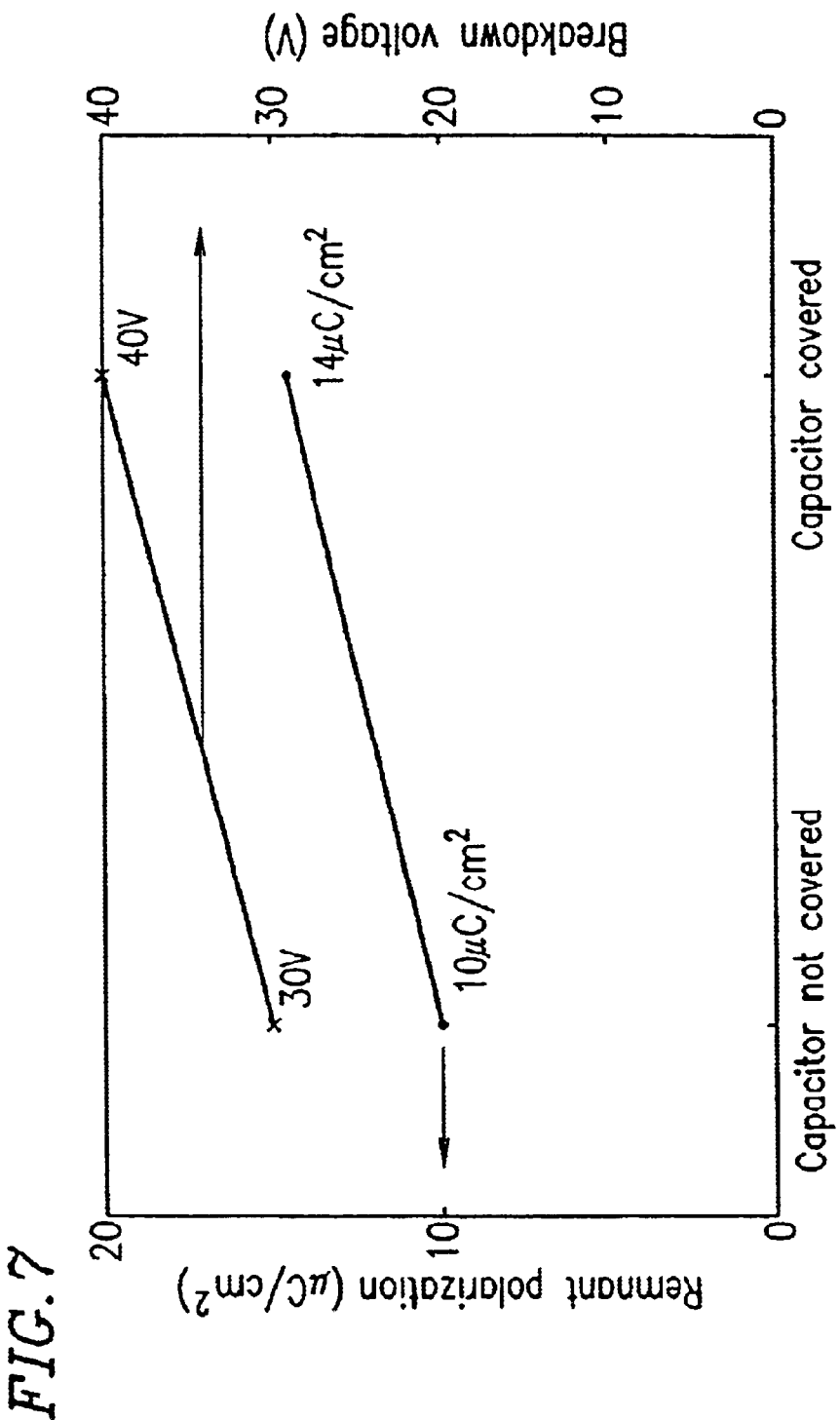
FIG. 7 is a graph illustrating characteristics of a capacitor in the semiconductor device in the third example.

FIG. 7 is a graph illustrating the characteristics (remnant polarization and breakdown voltage) of the capacitor 10 including a dielectric film 8 formed of $SrBi_2Ta_2O_9$, in the case where a second interconnect 17 is provided above the capacitor 10, and in the case where a second interconnect 17 is not provided above the capacitor 10. For measurement, the second interlayer insulating film 151 of ozone TEOS film is formed to have a thickness of 1 μm. The methods and conditions for measuring the remnant polarization and breakdown voltage are the same as those in the first example.

The following can be seen from FIG. 7. In the case where the second interconnect 17 is provided above the capacitor 10, the remnant polarization is 14 $\mu C/cm^2$ (as opposed to 10 $\mu C/cm^2$ without the second interconnect 17 covering the capacitor 10) and the breakdown voltage is 40 V (as opposed to 30 V without the second interconnect 17 covering the capacitor 10). Thus, the structure according to the third example of the present invention further improves the remnant polarization by 4 $\mu C/cm^2$ and the breakdown voltage by 10 V, as compared to the structure according to the first example of the present invention.

Figure 8A:
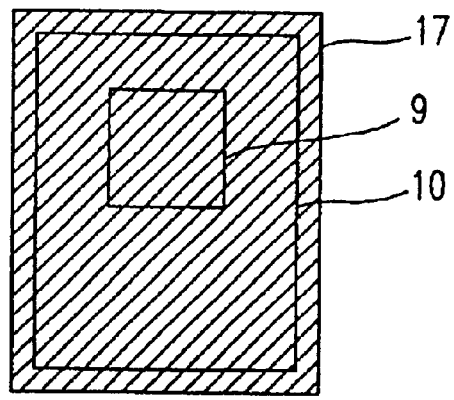
FIG. 8A is a partial plan view of the semiconductor device according to the third example of the present invention.
Figure 8B:
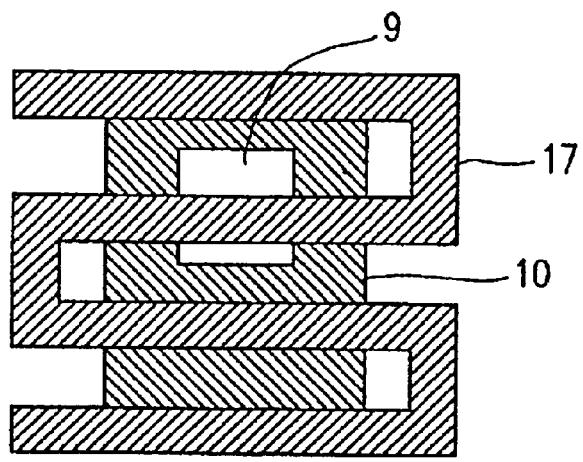
FIGS. 8B and 8C are modified plan views of semiconductor devices of the third example.
Figure 8C:
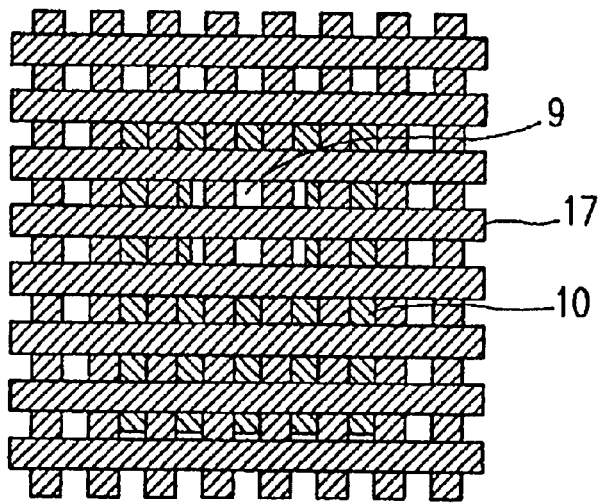

In the third example, a second interconnect 17 completely covers the entire capacitor 10. Alternatively, the second interconnect 17 can be formed to cover at least a part of the capacitor 10, whereby the same effect still being obtained. FIG. 8A is a plan view of a part of the semiconductor device 300 obtained by the step shown in FIG. 6E, the part including the capacitor 10. A second interconnect 17 completely covers the entire capacitor 10 in FIG. 8A. Alternatively, the second interconnect 17 can be provided in a substantially zigzag pattern as shown in FIG. 8B, or in a mesh pattern as shown in FIG. 8C.

Two or all of the first through third examples can be combined.

In the above-described examples, the passivation layer 18 is formed of silicon nitride. Alternatively, a laminate including silicon oxide and silicon nitride can be used, in which case the characteristics of the capacitor 10 are further improved. The laminate including silicon oxide and silicon nitride is formed in the following manner. A silicon oxide film is formed so as to have a tensile stress, and a silicon nitride film generally having a large compressive stress is formed thereon. Thus, the stress applied to the passivation layer 18 is entirely counteracted. Accordingly, the capacitor 10 is not influenced by the stress.

The laminate including silicon oxide and silicon nitride as the passivation layer 18 can be formed by normal-pressure CVD, low-pressure CVD or plasma CVD, using silane gas. The laminate can also be produced by forming a silicon oxide film, which is obtained using ozone TEOS, by normal-pressure CVD or low-pressure CVD and then forming a silicon nitride film thereon by plasma CVD.

Figure 9:
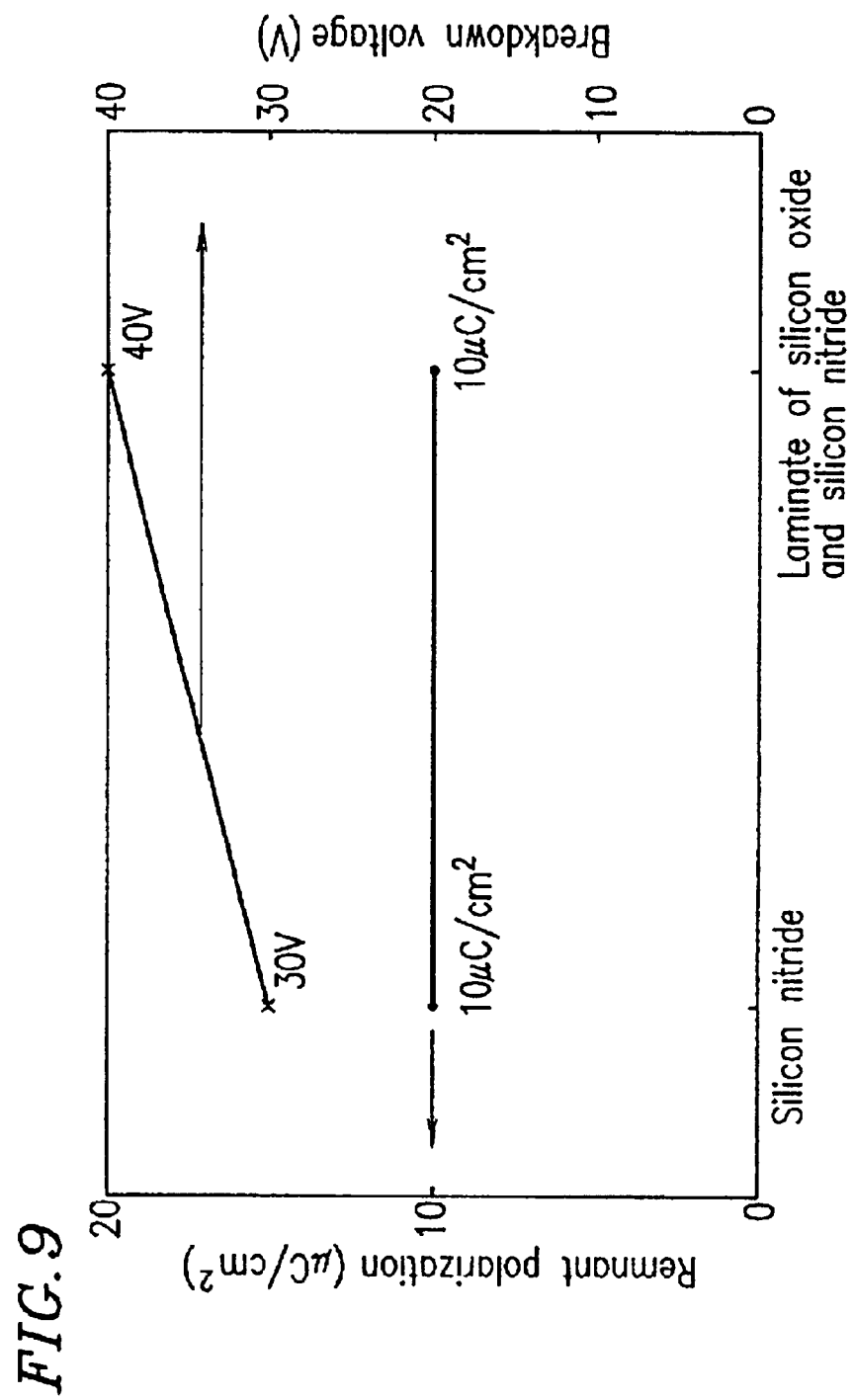
FIG. 9 is a graph illustrating characteristics of a capacitor in the semiconductor device in the third example.
Figure 10A:
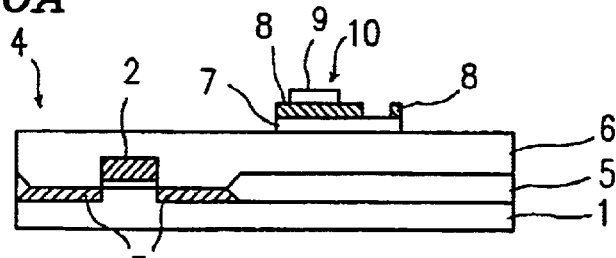
FIGS. 10A through 10E are cross-sectional views illustrating a conventional method for producing a semiconductor device.
Figure 10B:
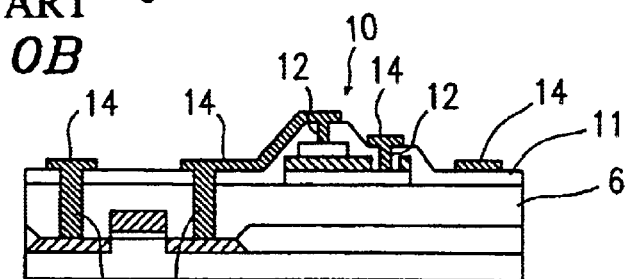
Figure 10C:
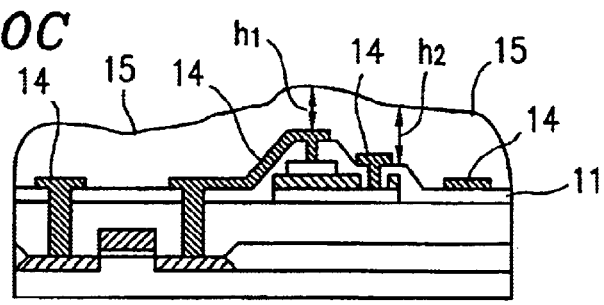
Figure 10D:
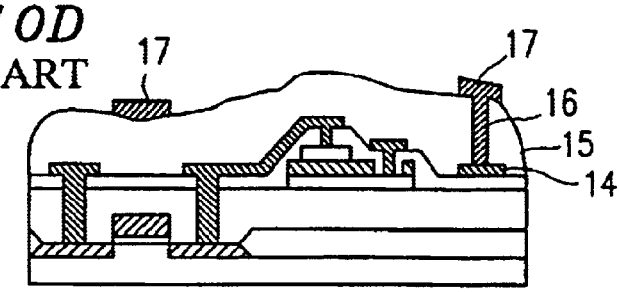
Figure 10E:
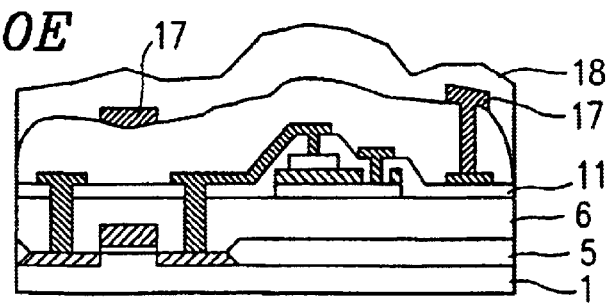

FIG. 9 is a graph illustrating the characteristics (remnant polarization and breakdown voltage) of the capacitor 10 including a dielectric film 8 formed of $SrBi_2Ta_2O_9$, in the case where a passivation layer 18 is formed of a single layer of silicon nitride, and in the case where a passivation layer 18 is formed of a laminate including silicon oxide and silicon nitride. For measurement, the passivation layer 18 formed of a single layer of silicon nitride is produced to have a thickness of 0.8 μm by plasma CVD. The passivation layer 18 formed of a laminate including silicon oxide and silicon nitride is produced by forming a silicon oxide film having a thickness of 0.1 μm by normal-pressure CVD and then forming a silicon nitride film having a thickness of 0.8 μm thereon by plasma CVD. The methods and conditions for measuring the remnant polarization and breakdown voltage are the same as those in the first example.

The following can be seen from FIG. 9. In the case where the passivation layer 18 is formed of a laminate including silicon oxide and silicon nitride, the breakdown voltage is 40 V (as opposed to 30 V). The remnant polarization is the same as in the case where the passivation layer 18 is formed of a single layer of silicon nitride. Thus, the use of a laminate including silicon oxide and silicon nitride as the passivation layer 18 further improves the breakdown voltage by 10 V, as compared to the structure according to the first example of the present invention.

The passivation layer 18 formed of a laminate including silicon oxide and silicon nitride can be combined with any structure described in the first through third examples.

In the first through third examples, the first interlayer insulating film 111 is formed of an ozone TEOS film. Alternatively, the first interlayer insulating film 111 can be formed of a silicon oxide film produced by normal-pressure CVD or low-pressure CVD using silane or disilane, or a silicon oxide film produced in this manner and further treated by phosphorus doping.

In the first through third examples, the first interconnect 14 is formed of a laminate including titanium, titanium nitride, aluminum and titanium nitride. Alternatively, the first interconnect 14 can be formed of a laminate including titanium, titanium nitride and aluminum; a laminate including titanium, titanium tungsten, aluminum and titanium tungsten; or a laminate including titanium, titanium tungsten and aluminum.

The ozone TEOS film forming the second interlayer insulating film 151 preferably has a Si—OH bond absorption coefficient of 800 cm$^{-1}$ or less at a wavelength corresponding to 3450 cm$^{-1}$. When the moisture content in the ozone TEOS film is thus reduced as low as possible, moisture which deteriorates the characteristics of the capacitor 10, especially OH radicals and H radicals, is restricted from entering the capacitor 10. Thus, generation of cracks by thermal treatment after the film formation is suppressed. Accordingly, the characteristics of the capacitor 10 are further improved.

The ozone TEOS film forming the second interlayer insulating film 151 preferably has a tensile stress of $1 \times 10^7$ dyn/cm$^2$ to $3 \times 10^9$ dyn/cm$^2$ inclusive. Due to such a tensile stress, adverse effects on the capacitor (e.g., undesirable restriction of polarization) caused by the stress applied to the capacitor are alleviated. Thus, the characteristics of the capacitor 10 are improved. A stress outside the above-mentioned range tends to cause the characteristics of the capacitor 10 to be deteriorated.

This effect largely relies on the fact that the stress is a tensile stress. A capacitor which is supplied with a tensile stress, e.g., from an ozone TEOS film has more preferable characteristics than a capacitor which is supplied with a compressive stress, e.g., from a plasma TEOS film, even when the absolute values of the stresses are equal.

The ozone TEOS film has a tensile stress presumably for the following reason. Upon the film formation, TEOS gas and ozone reacts on the substrate surface to form silicon oxide while a volume is reduced. In other words, a volume of the resultant silicon oxide (i.e., the resultant ozone TEOS film) becomes smaller than the sum of volumes of the involved TEOS gas and ozone. Furthermore, the subsequent thermal treatment causes the resultant ozone TEOS film to become more dense, thereby further constricting the film. Thus, the ozone TEOS film has a tensile stress, and accordingly, a tensile stress acts on the dielectric film 8 of the capacitor 10 provided below the ozone TEOS film.

On the other hand, a plasma TEOS film has a compressive stress presumably for the following reason. In this case, silicon oxide in the form of solid particles formed in the gas phase are deposited, and thus, a volume reduction does not occur. Furthermore, the solid silicon oxide particles tend to densely deposit, and further expand. Accordingly, a plasma TEOS film has a compressive stress. It is presumed that, when the compressive stress acts on the dielectric film 8 of the capacitor 10, generation of polarization in a direction connecting the upper electrode 9 and the lower electrode 7 (i.e., a direction perpendicular to the substrate) is restricted, as a result of which the characteristics of the capacitor 10 are deteriorated.

The thickness of the ozone TEOS film forming the second interlayer insulating film 151 is preferably between 0.3 μm to 1 μm inclusive. When the thickness exceeds 1 μm, the stress of the ozone TEOS film increases. The increased thickness may disadvantageously deteriorates the characteristics of the capacitor 10, and also tends to generate cracks when the first thermal treatment is performed as a part of post-treatment. When the thickness of the ozone TEOS film is less than 0.3 μm, sufficient step coverage is not obtained, and treatment of the ozone TEOS film may disadvantageously generate etching residues.

The ozone concentration upon forming the ozone TEOS film as the second interlayer insulating film 151 is preferably 5.5% or more. When the ozone concentration is set to such a range, the stress included in the ozone TEOS film is alleviated, and generation of cracks by thermal treatment is restricted. Accordingly, the characteristics of the capacitor 10 are further improved.

In the first to third examples, the temperature for the first thermal treatment is 450° C. The temperature can be in the range of 300° C. to 450° C. inclusive. When the temperature is in this range, the silicon oxide film produced using ozone TEOS becomes dense. Thus, the characteristics of the capacitor 10 are further improved. Furthermore, the first thermal treatment can be performed in a mixed gas atmosphere of oxygen and another gas in lieu of the oxygen atmosphere. When the mixed gas atmosphere is used, oxygen is supplied to the dielectric film 8, and thus, the characteristics of the capacitor 10 are further improved.

After the first thermal treatment, it is preferable that the ozone TEOS film forming the second interlayer insulating film 151 has a tensile stress of $1 \times 10^7$ dyn/cm$^2$ to $2 \times 10^9$ dyn/cm$^2$ inclusive. When the stress in the ozone TEOS film (second interlayer insulating film 151) is in the above-mentioned range even after the volume reduction of the ozone TEOS film (second interlayer insulating film 151) occurs due to the thermal treatment, the stress acting on the capacitor 10 is alleviated and thus deterioration in the characteristics of the capacitor 10 is restricted.

In the first through third examples, the second interconnect 17 is formed of a laminate including titanium, aluminum and titanium nitride. Alternatively, second interconnect 17 can be formed of a laminate including titanium and aluminum or a laminate including titanium, aluminum, titanium tungsten. The same effects are obtained.

In the first through third examples, the temperature for the second thermal treatment is 400° C. The temperature can be in the range of 300° C. to 450° C. inclusive. When the temperature is in this range, the stress of the second interconnect 17 is alleviated while the second interconnect 17 becomes dense. The second thermal treatment can be performed in an argon atmosphere, a helium atmosphere, or a mixed gas atmosphere of nitrogen and these gases in lieu of the nitrogen atmosphere. The same effects of obtaining the dense second interconnect 17 and alleviating the stress thereof are obtained.

As described above, according to the present invention, the stress acting on the capacitor is alleviated. Furthermore, since the stress is a tensile stress, the deterioration in the characteristics of the capacitor caused by the stress is restricted, and thus the capacitor obtains satisfactory characteristics. A semiconductor including such a capacitor enjoys excellent reliability even when having a multiple-interconnect structure.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device, comprising:
   a capacitor provided on a supporting substrate and including a lower electrode, a dielectric layer, and an upper electrode, said dielectric layer being formed from a ferroelectric material;
   a first interlayer insulating layer provided so as to cover the capacitor;
   a first interconnect selectively provided on the first interlayer insulating layer and electrically connected to the capacitor through a first contact hole formed in the first interlayer insulating layer;
   a second interlayer insulating layer consisting of an interlayer insulating film having a tensile stress provided directly on the first interconnect; and
   a second interconnect selectively provided directly on the second interlayer insulating layer and electrically connected to the first interconnect through a second contact hole formed in the second interlayer insulating layer.

2. A semiconductor device according to claim 1, further comprising,
   a passivation layer provided so as to cover the second interconnect, wherein the second interconnect is provided on the second interlayer insulating film so as to cover at least a part of the capacitor,
   the passivation layer is farmed from a laminate including a silicon oxide film and a silicon nitride film.

3. A semiconductor device according to claim 1, wherein the first Interconnect is formed from a laminate including titanium, titanium nitride, aluminum and titanium nitride; a laminate Including titanium, titanium nitride and aluminum; a laminate including titanium, titanium tungsten, aluminum and titanium tungsten; or a laminate including titanium, titanium tungsten and aluminum.

4. A semiconductor device according to claim 1, wherein a Si—OH bond absorption coefficient of the second interlayer insulating layer at a wavelength corresponding to 3450 $cm^{-1}$ is 800 $cm^{-1}$ or less.

5. A semiconductor device according to claim 1, wherein the second interlayer insulating layer has a tensile stress of $1 \times 10^7$ $dyn/cm^2$ to $3 \times 10^9$ $dyn/cm^2$ inclusive.

6. A semiconductor device according to claim 1, wherein the second interlayer insulating layer has a thickness of 0.3 $\mu m$ to 1 $\mu m$ inclusive.

7. A semiconductor device according to claim 1, wherein the second interconnect is formed from a laminate including titanium, aluminum and titanium nitride; a laminate including titanium and aluminum; or a laminate including titanium, aluminum and titanium tungsten.

8. The semiconductor device of claim 1 wherein the second interlayer insulating layer provides substantially flat step coverage of the first interconnect and the first interlayer insulating layer.

9. The semiconductor device of claim 1, further comprising a passivation layer provided so as to cover the second interconnect.

10. The semiconductor device of claim 1, wherein the second interlayer insulating layer being a singular layer.

11. The semiconductor device of claim 1, wherein the second interlayer insulating layer forming of thermal ozone TEOS.

12. The semiconductor device of claim 1, further comprising the supporting substrate having an integrated circuit thereon.

13. A semiconductor device, comprising:
    a capacitor provided on a supporting substrate and including a lower electrode, a dielectric layer, and an upper electrode, said dielectric layer including a remnant polarization of approximately 10 $\mu C/cm^2$;
    a first interlayer insulating layer provided so as to cover the capacitor;
    a first interconnect selectively provided on the first interlayer insulating layer and electrically connected to the capacitor through a first contact hole formed in the first interlayer insulating layer;
    a second interlayer insulating layer consisting of an interlayer insulating film having a tensile stress provided directly on the first interconnect; and
    a second interconnect selectively provided directly on the second interlayer insulating layer and electrically connected to the first interconnect through a second contact hole formed in the second interlayer insulating layer.

14. A semiconductor device, comprising:
    a capacitor provided on a supporting substrate and including a lower electrode, a dielectric layer, and an upper electrode, said dielectric layer including a remnant polarization of at least 10 $\mu C/cm^2$;
    a first interlayer insulating layer provided so as to cover the capacitor;
    a first interconnect selectively provided on the first interlayer insulating layer and electrically connected to the capacitor through a first contact hole formed in the first interlayer insulating layer;
    a second interlayer insulating layer consisting of an interlayer insulating film having a tensile stress provided directly on the first interconnect; and
    a second interconnect selectively provided directly on the second interlayer insulating layer and electrically connected to the first interconnect through a second contact hole formed in the second interlayer insulating layer.

15. A semiconductor device, comprising:
    a capacitor provided on a supporting substrate having an integrated circuit thereon and including a lower electrode, a dielectric film, and an upper electrode, said dielectric film being formed from either a dielectric material having a high dielectric constant or a ferroelectric material;
    a first interlayer insulating film provided so as to directly cover the capacitor;
    a first interconnect selectively provided on the first interlayer insulating film and electrically connected to the integrated circuit and the capacitor through a first contact hole formed in the first interlayer insulating film;

a second interlayer insulating layer consisting of an interlayer insulating film having a tensile stress provided directly on the first interconnect;

a second interconnect selectively provided directly on the second interlayer insulating layer and electrically connected to the first interconnect through a second contact hole formed in the second interlayer insulating layer;

a passivation layer provided so as to cover the second interconnect; and a hydrogen supplying layer provided between the first interconnect and the second interlayer insulating layer excluding an area in which the capacitor is provided.

16. A semiconductor device, comprising:

a capacitor provided on a supporting substrate having an integrated circuit thereon and including a lower electrode, a dielectric film, and an upper electrode;

a first interlayer insulating film provided so as to directly cover the capacitor, the first interlayer insulating film having a tensile stress;

a first interconnect selectively provided on the first interlayer insulating film and electrically connected to the integrated circuit and the capacitor through a contact hole formed in the first interlayer insulating film;

a second interlayer insulating layer consisting of an interlayer insulating film having a tensile stress provided directly on the first interconnect;

a second interconnect selectively provided directly on the second interlayer insulating layer and electrically connected to the first interconnect through a second contact hole formed in the second interlayer insulating layer;

a passivation layer provided so as to cover the second interconnect; and a hydrogen supplying layer provided between the first interconnect and the second interlayer insulating layer excluding an area in which the capacitor is provided.

* * * * *